United States Patent [19]
Pan

[11] Patent Number: 5,980,274
[45] Date of Patent: Nov. 9, 1999

[54] CONNECTOR HOUSING WITH SPACERS BETWEEN CONTACT PINS

[75] Inventor: Hua-Tseng Pan, Taipei, Taiwan

[73] Assignee: Hon Hai Precision Ind. Co., Ltd., Taipei Hsien, Taiwan

[21] Appl. No.: 08/975,923

[22] Filed: Nov. 21, 1997

[30] Foreign Application Priority Data

Nov. 22, 1996 [TW] Taiwan ................................. 85218084

[51] Int. Cl.⁶ .................................................. H01R 9/09
[52] U.S. Cl. ............................................................ 439/83
[58] Field of Search ...................................... 439/83, 876

[56] References Cited

U.S. PATENT DOCUMENTS

| | | | |
|---|---|---|---|
| 3,409,862 | 11/1968 | Lynch et al. | 439/79 |
| 4,385,795 | 5/1983 | Endoh et al. | 439/80 |
| 4,762,500 | 8/1988 | Dola et al. | 439/79 |
| 4,978,308 | 12/1990 | Kaufman | 439/83 |
| 5,636,999 | 6/1997 | Hirai et al. | 439/79 |

*Primary Examiner*—Neil Abrams
*Assistant Examiner*—T C Patel

[57] ABSTRACT

A connector housing includes a first interface containing contact portions of contact pins therein for electrically contacting an external complementary card and a second interface defining arrays of slits through which corresponding soldering portions of the contact pins to be soldered on a printed circuit board project. A plurality of spacers are formed on the second interface thus preventing solder from communicating with the soldering portions of adjacent contact pins.

4 Claims, 5 Drawing Sheets

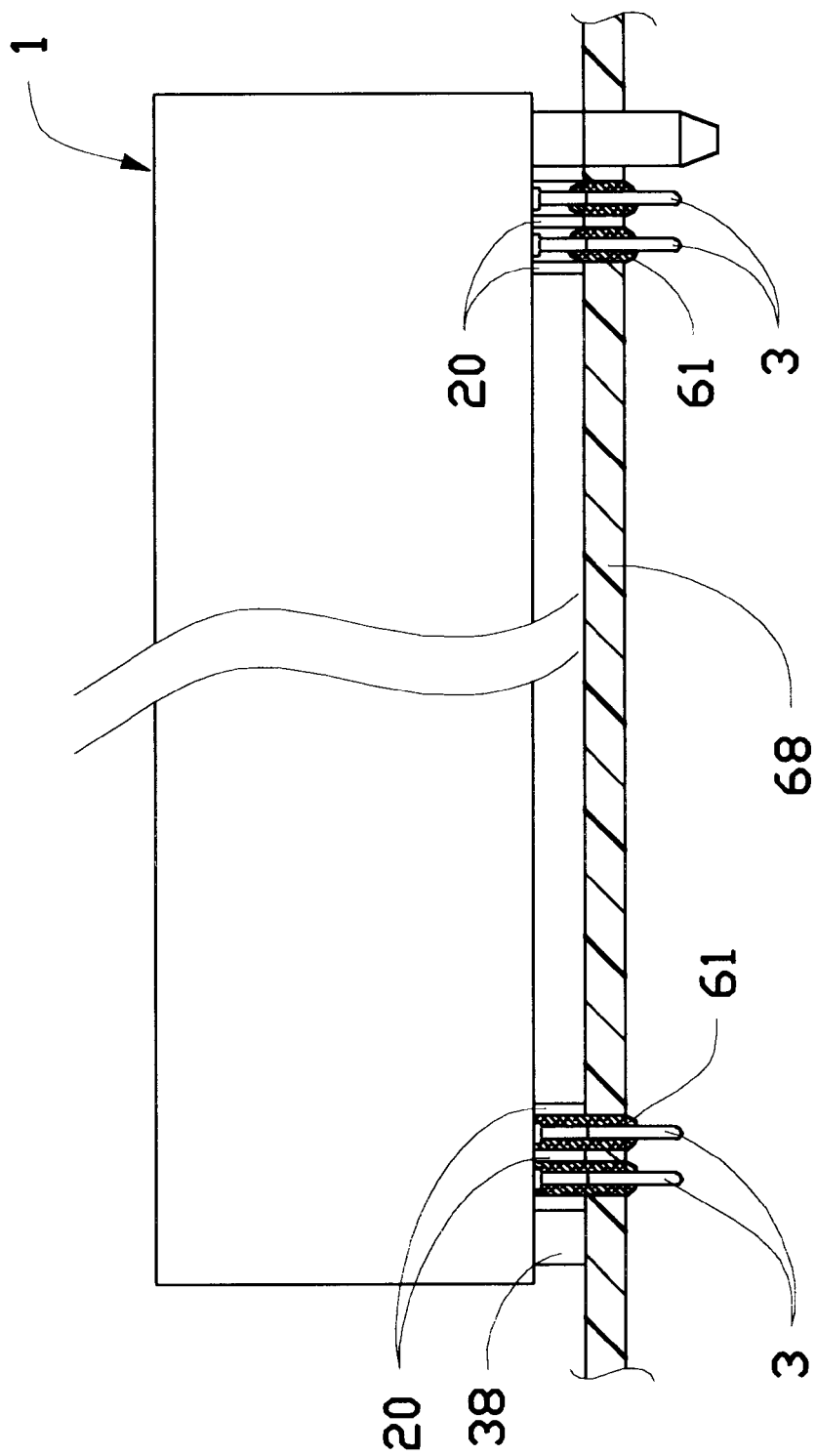

CONNECTOR HOUSING WITH SPACERS BETWEEN CONTACT PINS

BACKGROUND OF THE INVENTION

1. Field of The Invention

The present invention relates to a connector housing and particularly to a connector housing which utilizes spacers to prevent pins thereof from becoming short circuited when soldering the connector onto a printed circuit board (PCB).

2. The Prior Art

Connectors are commonly used in coupling electrical signals from one device (for example, a motherboard or a module card used in personal computers) to another device (for example, an edge card which has gold fingers formed on an edge thereof). Connectors have a variety of structures but, each connector generally includes an insulative housing and a plurality of conductive contact pins firmly fixed in the insulative housing.

Each contact pin basically includes a soldering portion at one end thereof, an engaging portion firmly received in a corresponding chamber defined in the insulative housing, and a contact portion for electrically contacting a corresponding gold finger (or contact) fixed in a complementary edge card (or in a male-type connector).

Normally, the soldering portion of each contact pin is a leg projecting from a first face (interface) of the insulative housing of the connector for soldering onto a PCB, while the contacts are formed on a second interface of the insulative housing for electrically contacting the complementary connector or edge card as previously mentioned.

Referring to FIG. 7, two rows of contact pins 6 are connected by a reel carrier tape 63 at respective shoulders 60 thereof. The two rows of contact pins 6 are inserted into and fixed in an insulative housing 50 via an operational machine (not shown), and then the reel carrier tape 63 is detached by the operational machine, thus forming two shoulders 60 on each contact pin 6. Subsequently, another two rows of contact pins are positioned in the same insulative housing 50 using the same method, therefore, a connector 5 with four rows of contact pins is formed.

Referring to FIG. 6, a printed circuit board (PCB) 68 configured with the connectors via holes 62 defined therein undergoes a wave soldering procedure. Thus the solder 61 is soldered to the soldering portion of the contact pins 6 substantially at a position corresponding to the hole 62 of the PCB 68. Most of the contact pins 6 are soldered on the PCB 68 properly such as the rightmost two contact pins 6. However, in some situations, especially when the wave amplitude of the wave soldering procedure is not maintained below a threshold level, the solder passing through two adjacent throughholes 62 is apt to sputter and combine into one integration thus resulting in a short circuit between the related two contact pins. Additionally, due to insufficient preheat of the contact pins 6, the temperature difference between the two sides of the PCB 68 is significant, therefore, when the solder passes through the holes 62 by means of a capillary, the pin portion above the PCB 68 (based on the orientation of the figure) will cause the entering solder to abruptly cool, thus, damaging the surface tension thereof and causing sputtering of the entering solder (the solder above the PCB 68) thereby resulting in a short circuit between adjacent contact pins 6. If a short circuit occurs, trouble shooting and related amendments will increase costs considerably thus reducing profits.

Short circuits are so critical that a new structure is required to eliminate short circuits due to improper wave soldering procedures or other reasons, such as a conductive wire being accidentally positioned between two contact pins when the connector is mounted on the PCB thereby retaining the conductive wire between the contact pins and the PCB.

SUMMARY OF THE INVENTION

The primary purpose of the present invention is to provide a new connector housing with spacers formed between pins projecting from a soldering interface thereof, thus preventing pins from being electrically short circuited when the connector and a PCB on which the connector is mounted undergo a wave soldering procedure.

In accordance with one aspect of the present invention, a connector housing includes a first interface containing contact portions of contact pins therein for electrically contacting an external complementary card, and a second interface defining arrays of slits through which corresponding soldering portions of the contact pins to be soldered on a printed circuit board project, characterized in that a plurality of spacers are formed on the second interface thus preventing solder from communicating with the soldering portions of adjacent contact pins.

In accordance with another aspect of this invention, a connector housing includes a first interface containing contact portions of contacting pins therein for electrically contacting an external complementary card, and a second interface defining rows of slits through which corresponding rows of soldering portions of the contact pins to be soldered on a printed circuit board project, characterized in that at least a row of spacers are formed on the second interface in a horizontal direction substantially perpendicular to a line of each row of the contact pins, thus preventing solder from communicating with the soldering portions of adjacent contact pins.

In accordance with a further aspect of this invention, a connector housing includes a first interface containing contact portions of contact pins therein for electrically receiving an external complementary card, and a second interface defining rows of slits through which corresponding rows of soldering portions of the contact pins to be soldered on a printed circuit board project, characterized in that at least a row of first spacers are formed on the second interface in a horizontal direction substantially perpendicular to a line of each row of the contact pins, and at least a row of second spacers are formed on the second interface in a lateral direction corresponding to a line of each row of the contact pins. The first spacers together with the second spacers prevent solder from communicating with the soldering portions of adjacent contact pins.

BRIEF DESCRIPTION OF THE DRAWINGS

FIG. 3B is a partial elevational view of the connector housing of FIG. 3A after insertion on a PCB and exposure to a wave soldering procedure;

DETAILED DESCRIPTION OF THE PREFERRED EMBODIMENTS

Figure 1:
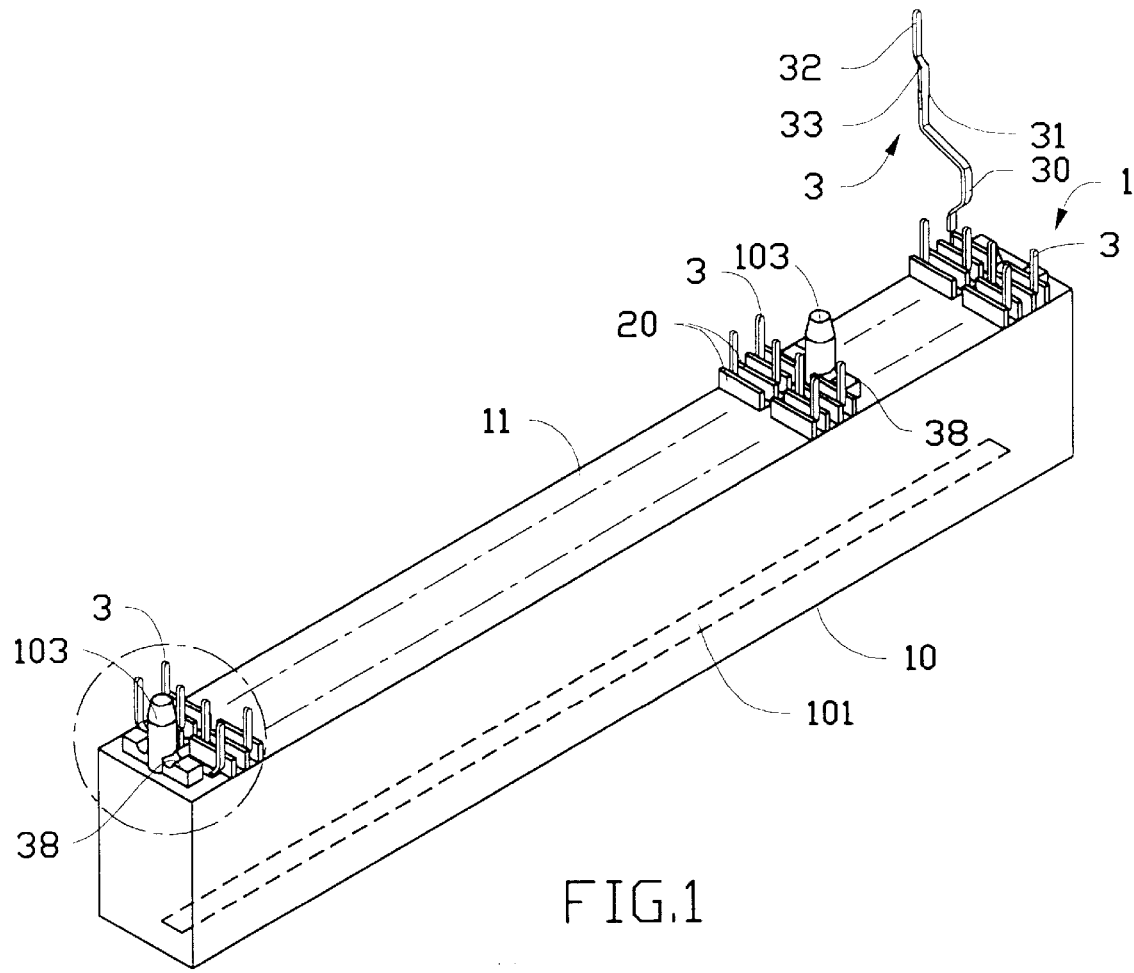
FIG. 1 is a perspective view of a connector housing in accordance with a first embodiment of the present invention.

References will now be described in detail to the preferred embodiments of the invention. For better understanding, most of the same components are designated by the same reference numerals throughout the various figures of the different embodiments.

Figure 2:
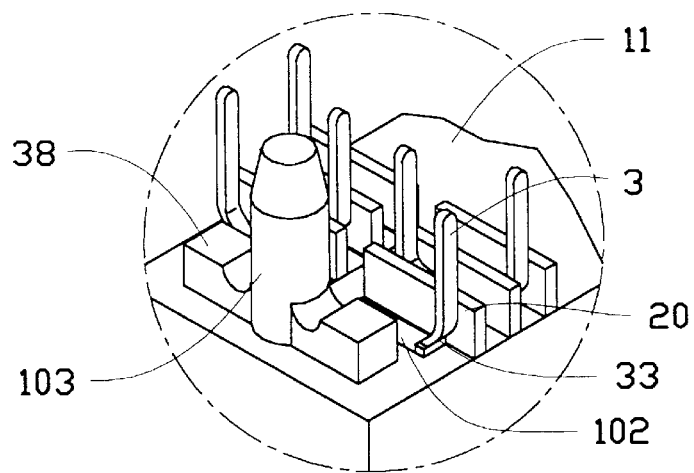
FIG. 2 is an enlarged view taken from the circled phantom portion of FIG. 1.

Referring to the drawings and initially to FIG. 1, a connector housing 1 in accordance with the present invention comprises a first interface 10 defining at least a slot 101 for receiving a plurality of contact pins 3 therein for electrically contacting corresponding gold fingers of an external complementary card (not shown), and a second interface 11 defining arrays of slits 102 (see FIG. 2) through each of the slit 102 a corresponding one of the contact pins 3 projecting. Each slit 102 is in communication with the slot 101, but adjacent slits 102 are defined and spaced from each other by solid portion of the second interface 11. Since the details of the slits 102 and the slot 101 are well known to those skilled persons in this field, they are omitted herein. The connector housing 1 is made of insulative material such as plastic. Each contact pin 3 includes a soldering portion 32 at one end thereof, an engaging portion 31 firmly received in a corresponding slit 102, and a contact portion 30 for electrically contacting the corresponding gold finger fixed in the complementary edge card (not shown). FIG. 2 is an enlarged view taken from the circled phantom portion of FIG. 1 for illustrative purpose.

Figure 3A:
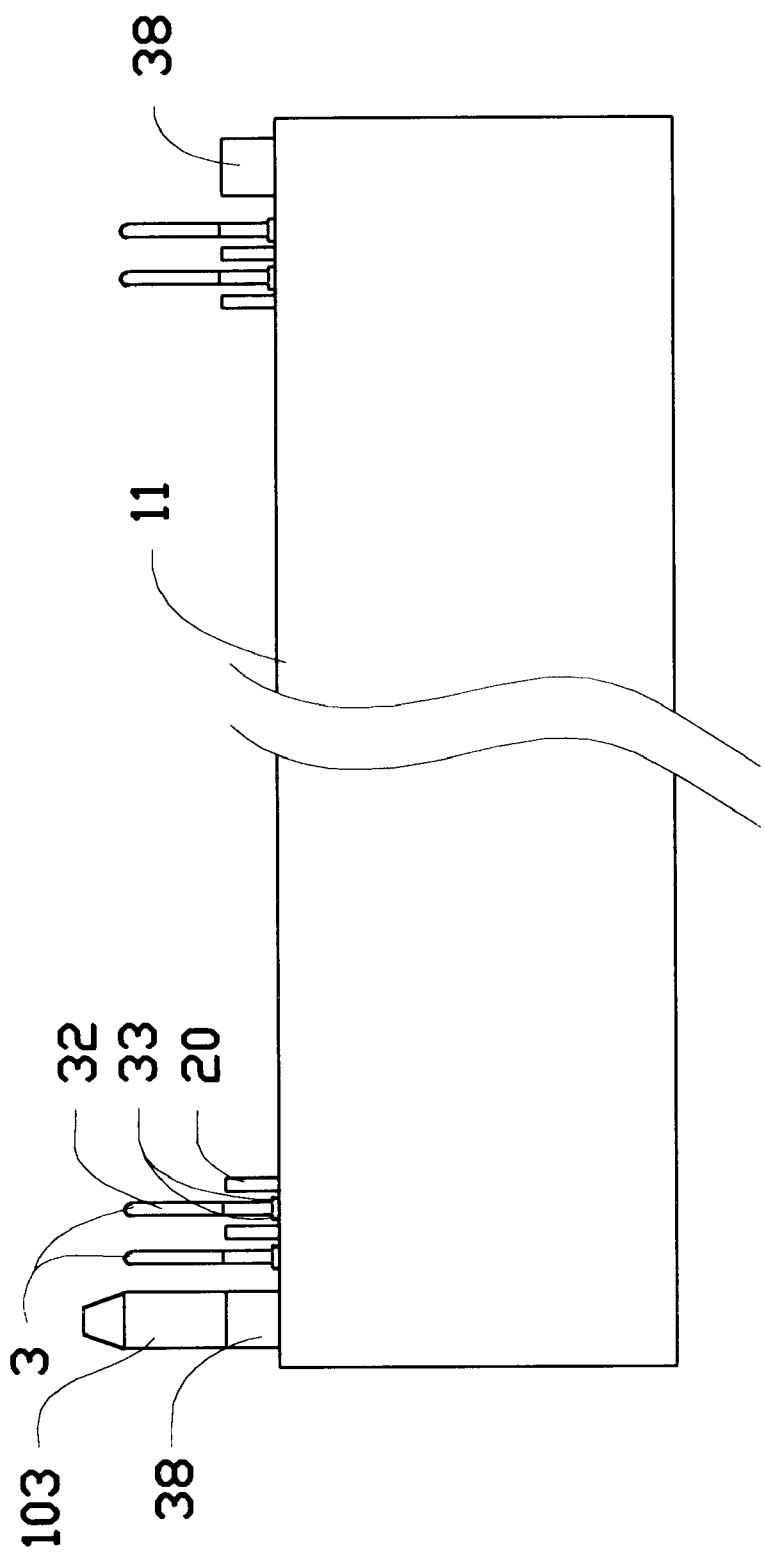
FIG. 3A is a partial elevational view of the connector housing in accordance with the present invention.

Also referring to FIGS. 3A and 3B, conventional guide posts 103 are formed on the second interface 11 for guiding and positioning the connector housing 1 on a PCB 68. Conventional stand-offs 38 are also formed on the second interface 11 for distancing the surface of the second interface 11 from the PCB 68.

Figure 7:
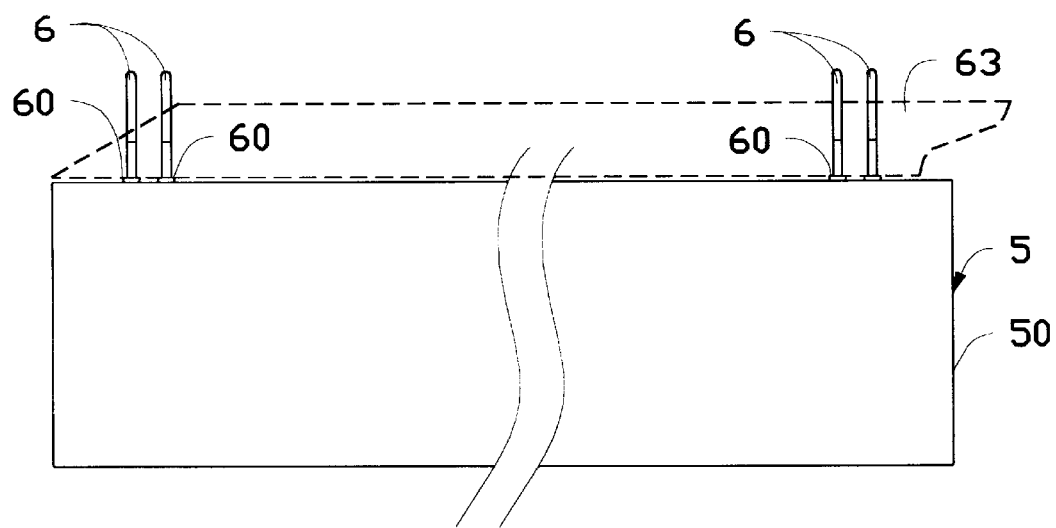
FIG. 7 is a partial elevational view of a conventional connector housing having contact pins inserted therein by a reel tape carrier before detachment from the contact pins.

Two shoulder portions 33 are formed on each contact pin 3 after the detachment of a related reel tape carrier (not shown, but identical to the one shown in FIG. 7 of the prior art). The feature of this invention focuses on a plurality of spacers 20 formed on the second interface 11 thus preventing communication between adjacent contact pins 3 and eliminating the possibility of a short circuit which has occurred in the prior art due to improper control of the wave soldering procedure. In this embodiment, each spacer 20 extends in a horizontal direction substantially perpendicular to a line of each row of the contact pins 3. More specifically, one side of each spacer 20 should be in alignment with a side wall of the housing 1 so as to guarantee that the spacers 20 totally isolate any two adjacent contact pins 3. However, if the spacer 20 extends in another direction other than the one perpendicular to the line of each row of the contact pins 3, the same result may also be achieved. Therefore, the extending direction of each spacer 20 is not limited to a specific one.

The first embodiment describes a card edge connector. In fact, any kind of connector which includes pins for being soldered on a PCB is covered by the present invention.

Figure 4:
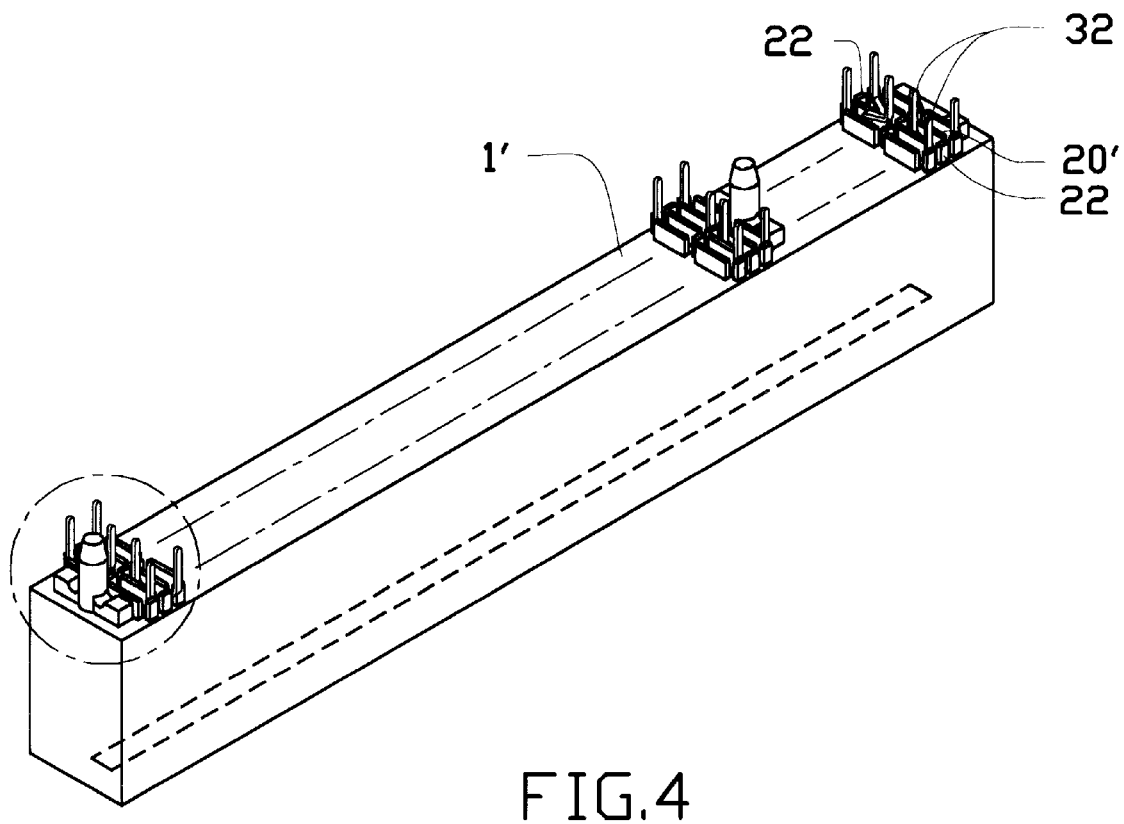
FIG. 4 is a perspective view of the connector housing in accordance with a second embodiment of the present invention.
Figure 5:
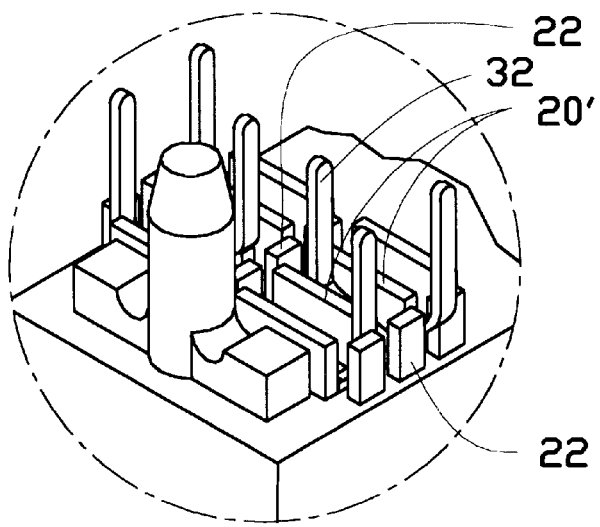
FIG. 5 is an enlarged view taken from the circled phantom portion of FIG. 4.
Figure 6:
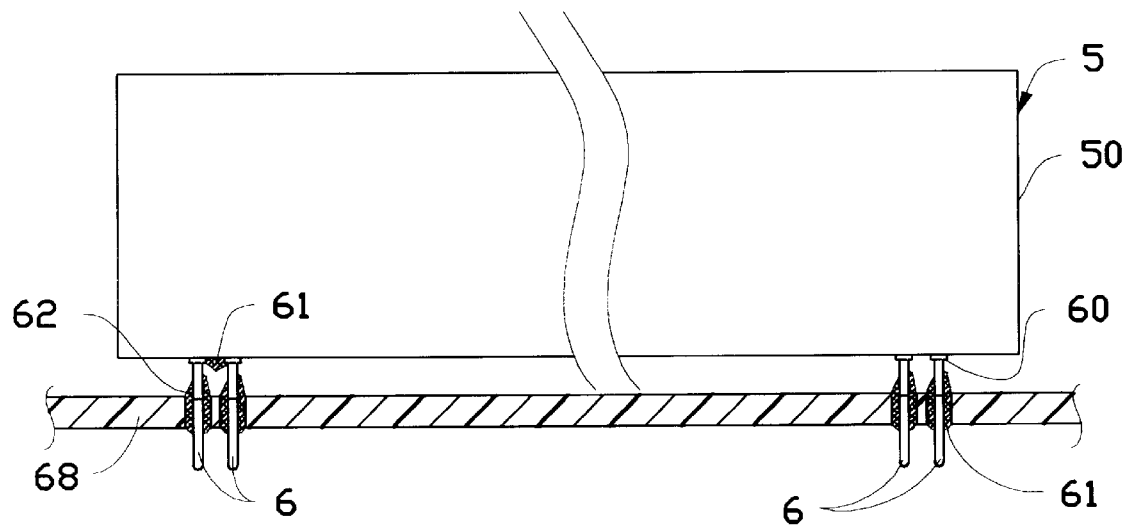
FIG. 6 is a partial elevational view of a conventional connector housing soldered on a PCB showing properly and improperly soldered contact pins.

Referring to FIGS. 4 and 5, a second embodiment of a connector housing 1' in accordance with the present invention is shown. The only difference between the second embodiment and the first embodiment is that the arrangement and orientation are different. The connector housing 1' has a plurality of first spacers 20' which are similar to the spacers 20 in the first embodiment except that the horizontal length of the spacer 20' is smaller than that of the first embodiment. Three rows of second spacers 22 are formed between the four rows of contact pins 3. Each contact pin 3 is blocked from the adjacent pin by both the first and second spacers 20' and 22. The horizontal direction of each spacer 20', 22 is not limited to a specific direction, i.e., the horizontal direction of each of the spacers 20' and 22 is not limited to the perpendicular of a line of each row of the contact pins 3.

While the present invention has been described with reference to specific embodiments, the description is illustrative of the invention and is not to be construed as limiting the invention.

Therefore, various modifications to the present invention can be made to the preferred embodiments by those skilled in the art without departing from the true spirit and scope of the invention as defined by the appended claims.

I claim:

1. A connector housing including a first interface (10) containing contact portions (30) of contact pins (3) therein for electrically receiving an external complementary card, and a second interface (11) defining rows of slits (102) through which corresponding rows of soldering portions (32) of the contact pins (3) to be soldered on a printed circuit board (68) project, further comprising:

at least a first row of spacers (20') formed on the second interface (11) wherein each spacer (20') extends in a horizontal direction substantially perpendicular to a line of each row of the contact pins (3), thus preventing solder from communicating with the soldering portions (32) of adjacent contact pins (3);

at least a second row of spacers (22) formed on the second interface (11) wherein each spacer (22) extends in a horizontal direction substantially not perpendicular to a line of each row of the contact pins (3), thus preventing solder from communicating with the soldering portions (32) of adjacent contact pins (3).

2. The connector housing as claimed in claim 1, wherein the spacers (20') have a vertical height substantially greater than the vertical height of shoulder portions (33) of the soldering portion (32) of the contact pins (3) which are formed after detachment of a reel tape carrier (63) from the contact pins (3).

3. A connector housing including a first interface (10) containing contact portions (30) of contact pins (3) therein for electrically contacting an external complementary card, and a second interface (11) defining rows of slits (102) through which corresponding rows of solder portions (32) of the contact pins (3) to be soldered on a printed circuit board (68) project, further comprising:

at least a row of first spacers (20') formed on the second interface (11) wherein each first spacer (20') extends in a horizontal direction substantially perpendicular to a line of each row of the contact pins (3), and at least a row of second spacers (22) formed on the second interface (11) wherein each second spacer (22) extends in a horizontal direction substantially parallel to a line of each row of the contact pins (3);

wherein the first spacers (20') together with the second spacers (22) prevent solder from communicating with the solder portions (32) of adjacent contact pins (3).

4. The connector housing as claimed in claim 3, wherein the first spacers (20') and the second spacers (22) each have a vertical height substantially greater than the vertical height of shoulder portions (33) of the soldering portion (32) of the contact pins (3) which are formed after detachment of a reel tape carrier (63) from the contact pins (3).

* * * * *